(12) United States Patent
Aas et al.

(10) Patent No.: US 11,629,842 B2
(45) Date of Patent: *Apr. 18, 2023

(54) SELECTIVELY FROSTED OPTICAL ELEMENT FOR BEAM SHAPING

(71) Applicant: Lumileds LLC, San Jose, CA (US)

(72) Inventors: Mehdi Aas, Eindhoven (NL); Charles André Schrama, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/530,282

(22) Filed: Nov. 18, 2021

(65) Prior Publication Data

US 2022/0074571 A1 Mar. 10, 2022

Related U.S. Application Data

(63) Continuation of application No. 16/859,635, filed on Apr. 27, 2020, now Pat. No. 11,209,147, which is a
(Continued)

(51) Int. Cl.
*F21V 5/08* (2006.01)
*F21Y 115/10* (2016.01)
*F21V 23/00* (2015.01)

(52) U.S. Cl.
CPC .............. *F21V 5/08* (2013.01); *F21V 23/003* (2013.01); *F21Y 2115/10* (2016.08)

(58) Field of Classification Search
CPC ....................................................... F21V 5/08
See application file for complete search history.

(56) References Cited

U.S. PATENT DOCUMENTS

| 8,602,591 B2 | 12/2013 | Lee |
| 9,039,252 B2 | 5/2015 | Treanton |

(Continued)

FOREIGN PATENT DOCUMENTS

| CN | 101526177 A | 9/2009 |
| CN | 105247273 A | 1/2016 |

(Continued)

OTHER PUBLICATIONS

"International Application Serial No. PCT/US2020/030714, International Preliminary Report on Patentability dated Nov. 11, 2021", 16 pgs.

(Continued)

*Primary Examiner* — Alexander K Garlen
(74) *Attorney, Agent, or Firm* — Schwegman, Lundberg & Woessner, P.A.

(57) ABSTRACT

An apparatus can include a lens that can shape light emerging from a light emitting diode (LED). The emergent light from the LED can be substantially centered around an LED axis. An incident surface of the lens can be positioned to face the LED. The incident surface can include a concave portion. The concave portion can be substantially smooth, so as not to substantially scatter light that strikes the concave portion. The concave portion can be substantially centered around a concave portion axis that is non-coaxial with the LED axis. The incident surface can include a scattering portion, positioned away from the concave portion, which can be textured so as to scatter light that strikes the scattering portion. An exiting surface of the lens can optionally include a generally planar portion that at least partially surrounds a substantially smooth convex portion.

20 Claims, 11 Drawing Sheets

Related U.S. Application Data continuation of application No. 16/533,466, filed on Aug. 6, 2019, now Pat. No. 10,677,419.

(60) Provisional application No. 62/841,518, filed on May 1, 2019.

(56) References Cited

U.S. PATENT DOCUMENTS

| | | | |
|---|---|---|---|
| 9,784,429 | B2 | 10/2017 | Lv et al. |
| 10,677,419 | B1 | 6/2020 | Aas et al. |
| 11,029,147 | B2 | 6/2021 | Abovitz et al. |
| 11,209,147 | B2 | 12/2021 | Aas et al. |
| 2008/0239722 | A1 | 10/2008 | Wilcox |
| 2008/0273324 | A1 | 11/2008 | Becker et al. |
| 2010/0172140 | A1 | 7/2010 | Chen et al. |
| 2011/0013394 | A1 | 1/2011 | Lenderink et al. |
| 2011/0019425 | A1 | 1/2011 | Chen et al. |
| 2011/0235338 | A1 | 9/2011 | Chen et al. |
| 2011/0292658 | A1 | 12/2011 | Ho |
| 2011/0320024 | A1 | 12/2011 | Lin et al. |
| 2012/0050889 | A1 | 3/2012 | Lu et al. |
| 2012/0051047 | A1 | 3/2012 | Lu et al. |
| 2013/0320843 | A1 | 12/2013 | Lee et al. |
| 2014/0126218 | A1 | 5/2014 | Lin et al. |
| 2015/0078011 | A1 | 3/2015 | Sy et al. |
| 2015/0204508 | A1 | 7/2015 | Kim et al. |
| 2015/0323157 | A1 | 11/2015 | Jeong et al. |
| 2016/0146426 | A1 | 5/2016 | Wu et al. |
| 2018/0347786 | A1 | 12/2018 | Feng |
| 2019/0186710 | A1 | 6/2019 | Lim et al. |
| 2020/0348006 | A1 | 11/2020 | Aas et al. |

FOREIGN PATENT DOCUMENTS

| | | |
|---|---|---|
| CN | 114096909 A | 2/2022 |
| EP | 2287640 A2 | 2/2011 |
| EP | 2287640 A3 | 2/2012 |
| TW | 202045858 A | 12/2020 |
| WO | 2020223485 A1 | 11/2020 |

OTHER PUBLICATIONS

U.S. Appl. No. 16/533,466, U.S. Pat. No. 10,677,635, filed Aug. 6, 2019, Selectively Frosted Optical Element for Beam Shaping.

U.S. Appl. No. 16/859,635, filed Apr. 27, 2020, Selectively Frosted Optical Element for Beam Shaping.

"U.S. Appl. No. 16/533,466, Corrected Notice of Allowability dated Apr. 27, 2020", 2 pgs.

"U.S. Appl. No. 16/533,466, Notice of Allowance dated Jan. 29, 2020", 10 pgs.

"U.S. Appl. No. 16/859,635, Advisory Action dated Jul. 12, 2021", 3 pgs.

"U.S. Appl. No. 16/859,635, Examiner Interview Summary dated Jun. 29, 2021", 2 pgs.

"U.S. Appl. No. 16/859,635, Final Office Action dated May 4, 2021", 10 pgs.

"U.S. Appl. No. 16/859,635, Non Final Office Action dated Jan. 11, 2021", 11 pgs.

"U.S. Appl. No. 16/859,635, Notice of Allowance dated Aug. 25, 2021", 8 pgs.

"U.S. Appl. No. 16/859,635, Response filed Apr. 12, 2021 to Non Final Office Action dated Jan. 11, 2021", 10 pgs.

"U.S. Appl. No. 16/859,635, Response filed Jul. 1, 2021 to Final Office Action dated May 4, 2021", 9 pgs.

"European Application Serial No. 19205688.5, Extended European Search Report dated Apr. 20, 2020", 9 pgs.

"International Application Serial No. PCT/US2020/030714, International Search Report dated Sep. 11, 2020", 7 pgs.

"International Application Serial No. PCT/US2020/030714, Invitation to Pay Additional Fees dated Jul. 21, 2020", 16 pgs.

"International Application Serial No. PCT/US2020/030714, Written Opinion dated Sep. 11, 2020", 14 pgs.

"Taiwanese Application Serial No. 109114681, Office Action dated Sep. 30, 2020", (w/English Translation), 6 pgs.

"Taiwanese Application Serial No. 109114681, Response filed Dec. 21, 2020 to Office Action dated Sep. 30, 2020", w/ English Claims, 6 pgs.

SELECTIVELY FROSTED OPTICAL ELEMENT FOR BEAM SHAPING

RELATED APPLICATION AND PRIORITY CLAIM

This application is a continuation of U.S. application Ser. No. 16/859,635, filed Apr. 27, 2020, which is a continuation of U.S. application Ser. No. 16/533,466, filed Aug. 6, 2019, which claims priority to U.S. Provisional Patent Application No. 62/841,518, filed on May 1, 2019, and entitled "System And Method Using Selectively Frosted Optical Element," the entirety of each of which are incorporated herein by reference.

TECHNICAL FIELD

The present disclosure relates to an apparatus and method that include a lens configured to shape a light beam emerging from a light emitting diode (LED).

BACKGROUND

In some applications, such as sensors for autonomous driving vehicles, illumination is provided at one or more infrared wavelengths. Under certain circumstances, such as at night, a human eye can perceive the infrared illumination as being red light.

BRIEF DESCRIPTION OF THE DRAWINGS

FIGS. 1-10 show various views of an apparatus, including a lens that can shape light emerging from a light emitting diode (LED), in accordance with some embodiments. In the views presented herein, it is assumed that light emerges from a front of the lens, such that the LED can be positioned to a rear of the lens. The terms "front", "rear", "top", "side", and other directional terms are used merely for convenience in describing the lens and other elements, and should not be construed as limiting in any way.

FIG. 1 shows a rear view of a lens, with cross-hatching indicating a textured portion, in accordance with some embodiments.

FIG. 2 shows a front view of the lens of FIG. 1, in accordance with some embodiments.

FIG. 4 shows a bottom-facing cross-sectional view of the lens of FIGS. 1 and 2, taken in a broken cross-section shown in FIG. 3A, with a controller, circuitry and LEDs, in accordance with some embodiments.

FIG. 5 shows a (right) side cross-sectional view of the lens of FIGS. 1 and 2, taken in a cross-section shown in FIG. 3A, with a controller, circuitry and an LED, in accordance with some embodiments.

FIG. 6 shows a close-up of a first portion of the cross-sectional view of FIG. 4, the first portion extending through a center of a concave surface of the lens, with an LED, in accordance with some embodiments.

FIG. 7 shows a close-up of a second portion of the cross-sectional view of FIG. 4, the second portion being decentered with respect to the concave surface of the lens, in accordance with some embodiments.

FIG. 9 shows a bottom cross-sectional view of the lens of FIGS. 1 and 2, taken in a cross-section shown in FIG. 8A, in accordance with some embodiments.

FIG. 10 shows a close-up of the (right) side cross-sectional view of FIG. 5, in accordance with some embodiments.

Figure 1:
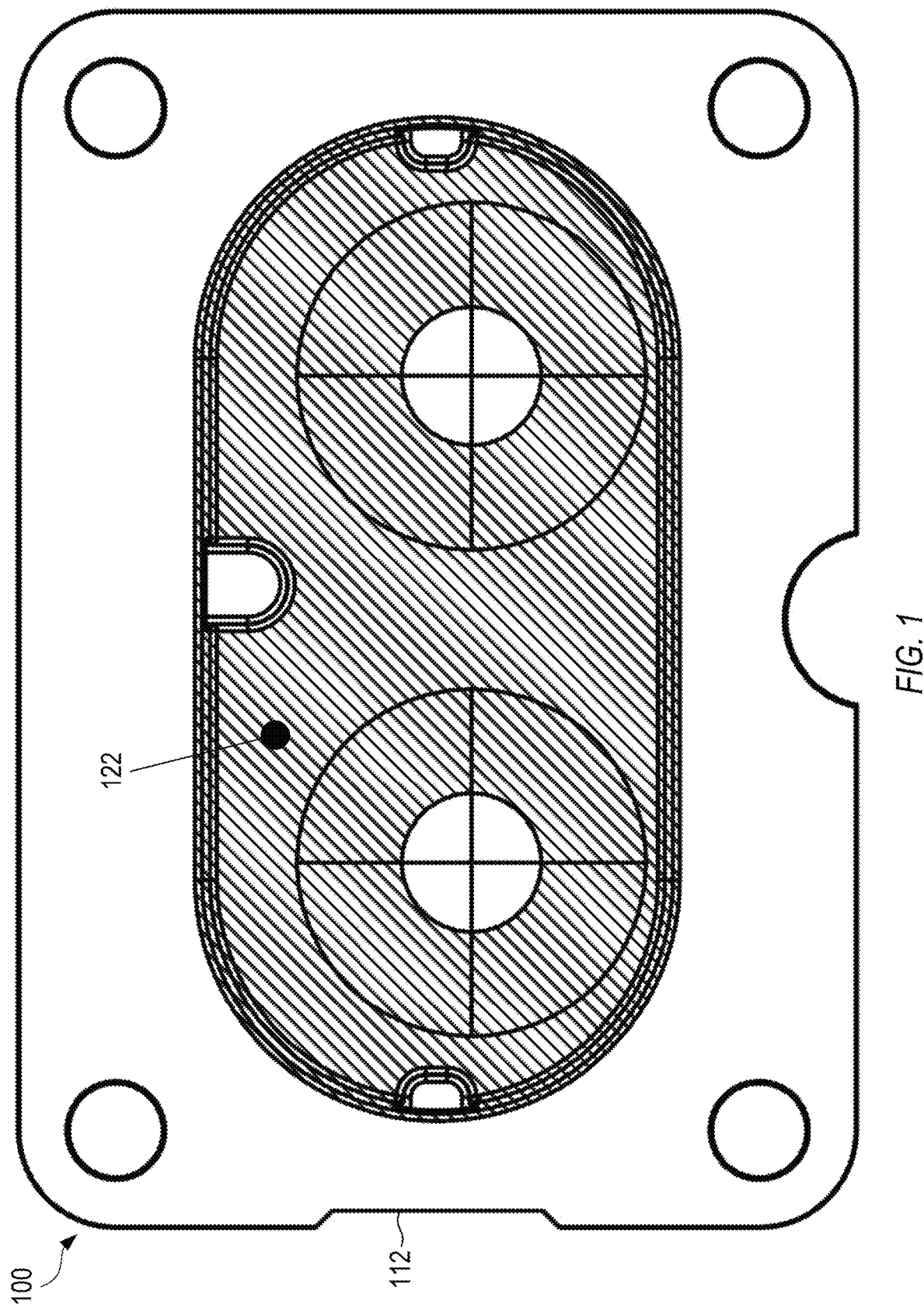

Corresponding reference characters indicate corresponding parts throughout the several views. Elements in the drawings are not necessarily drawn to scale. The configurations shown in the drawings are merely examples, and should not be construed as limiting the scope of the disclosed subject matter in any manner.

DETAILED DESCRIPTION

There are government regulations (such as Society of Automotive Engineers (SAE) J578, a standard defined and promulgated by SAE International) regarding the color of lights positioned on an exterior of a vehicle. In general, for typical passenger vehicles, the government regulations require that lights on the front of a vehicle only emit white light, lights on the left and right sides of a vehicle only emit amber light, and lights on the rear of a vehicle only emit red light. In other countries of the world that do not adhere to the SAE J578 standard, other visible colors of light may be acceptable in various locations on a vehicle.

Modern safety systems on a vehicle can produce images of the vehicle's surroundings, or retrieve data regarding the vehicle's surroundings, for use in accident prevention and object avoidance. In addition, autonomous driving or assisted-driving applications can also retrieve data regarding the vehicle's surroundings. Because the government regulations place requirements on light emitted from the vehicle for wavelengths up to 780 nm, and are silent regarding infrared light emitted at wavelengths longer than 780 nm, using such infrared light to illuminate the vehicle's surroundings can benefit the safety systems on the vehicle.

For example, illuminating the surroundings, rather than relying on reflections of ambient light, is beneficial because illumination can allow the safety system to operate at night. Using infrared light for illumination, rather than illuminating with visible light, is beneficial because infrared light is largely invisible to the human eye and does not create issues for other vehicle drivers. Further, using a specific, and relatively narrow, wavelength range for illumination and detection can be beneficial, because the illumination and detection can occur at a brightness level that can be significantly larger than what is present in ambient sunlight. For example, if illumination and detection occur in a relatively narrow infrared wavelength range centered about 940 nm (or another suitable infrared wavelength), it can be straightforward to illuminate with enough power to drown out any illumination effects caused by ambient sunlight or by other light-emitting elements in the surroundings. The power used for such narrowband illumination and detection can be small enough to avoid damaging eye tissue or other living tissue in the surroundings.

However, illuminating the surroundings with infrared light can cause an unexpected problem. As an artifact of human vision, the emissions from an infrared light source can spuriously be perceived by the human eye as being red. Specifically, while the infrared light reflected from the surroundings can be at an intensity low enough to be invisible to the human eye, a viewer looking directly into the infrared light source may view the relatively high intensity of the light source as spuriously glowing red. As the emitting wavelengths increase (and, therefore, move farther away from the long-wavelength end of the visible spectrum, typically considered to be around 700 nm), the spurious effect decreases, but is still present.

As a result, simply placing an infrared source on the front or sides of a vehicle can be problematic, because to the human eye, such a source would be perceived as a red light, which is prohibited by the government regulations. To overcome the problem of the infrared light source positioned on a front or sides of a vehicle exterior being perceived as a red light, a visible light source of a permitted color can be positioned in close proximity to the infrared light source. Visible light emitted from the visible light source can overlap with and mask the infrared light emitted from the infrared light source. The infrared and visible light sources, together, are perceived by the human eye as being a single light emitter having a color of the visible light source. Thus, a white light source can be used on a front of the vehicle, while an amber light source can be used on sides of the vehicle.

The apparatus discussed herein can be suitable for providing the infrared and visible light discussed above. The apparatus can include a lens that can shape a beam output from an LED. In some examples, the LED can emit light in the infrared portion of the electromagnetic spectrum. In some examples, the lens can optionally angularly widen an output from an additional LED, which can also emit light in the infrared portion of the electromagnetic spectrum. In some examples, the lens can optionally direct light from an additional visible LED through the lens, optionally with different widening properties than for the infrared LEDs. In some examples, the lens can optionally be configured as a cover, which can have an exiting surface that can also be an external face of the apparatus.

An apparatus can include a lens that can shape light emerging from an LED. The emergent light from the LED can be substantially centered around an LED axis. An incident surface of the lens can be positioned to face the LED. The incident surface can include a concave portion. The concave portion can be substantially smooth, so as not to substantially scatter light that strikes the concave portion. The concave portion can be substantially centered around a concave portion axis that is non-coaxial with the LED axis. The incident surface can include a scattering portion, positioned away from the concave portion, which can be textured so as to scatter light that strikes the scattering portion. An exiting surface of the lens can optionally include a generally planar portion that at least partially surrounds a substantially smooth convex portion. As used herein, the phrase generally planar is intended to mean planar to within typical manufacturing tolerance and/or typical alignment tolerances FIGS. 1-10 show various views of an apparatus 100, including a lens that can shape light emerging from a light emitting diode (LED), in accordance with some embodiments. In the views presented herein, it is assumed that light emerges from a front of the lens, such that the LED can be positioned to a rear of the lens. The terms "front", "rear", "top", "side", and other directional terms are used merely for convenience in describing the lens and other elements, and should not be construed as limiting in any way.

FIG. 1 shows a rear view of a lens, with cross-hatching indicating a textured portion, in accordance with some embodiments.

Figure 2:
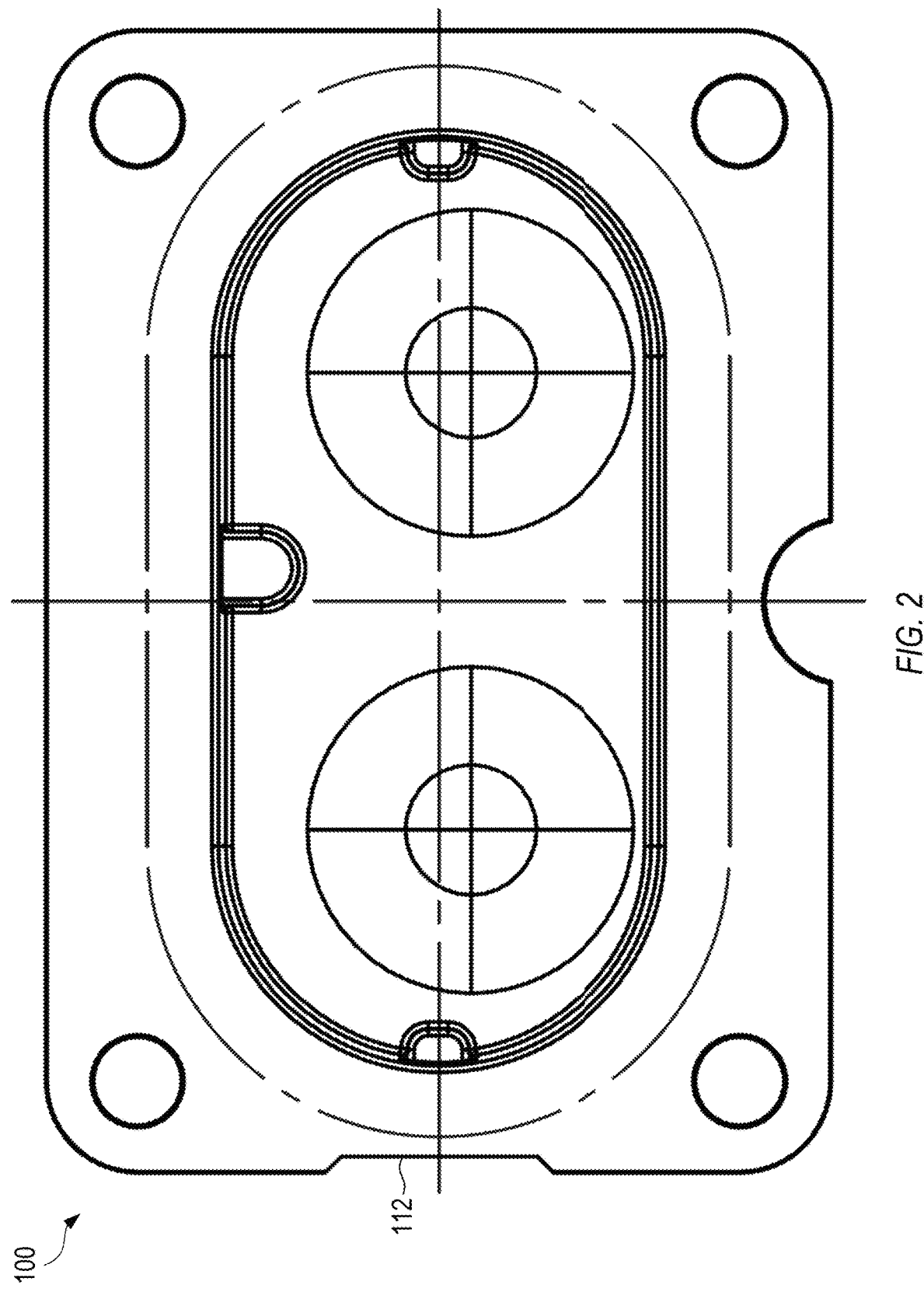

FIG. 2 shows a front view of the lens of FIG. 1, in accordance with some embodiments.

Figure 3C:
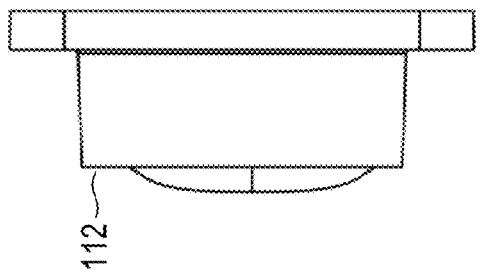
FIG. 3C shows a side view of the lens of FIGS. 1 and 2, in accordance with some embodiments.
Figure 3A:
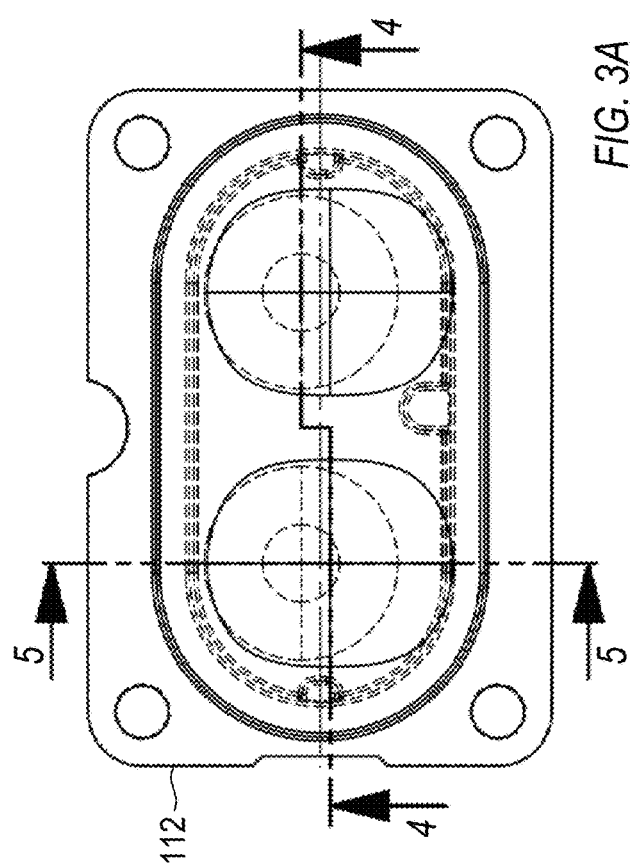
FIG. 3A shows a front view of the lens of FIGS. 1 and 2, in accordance with some embodiments.

FIG. 3A shows a front view of the lens of FIGS. 1 and 2, in accordance with some embodiments.

Figure 3B:
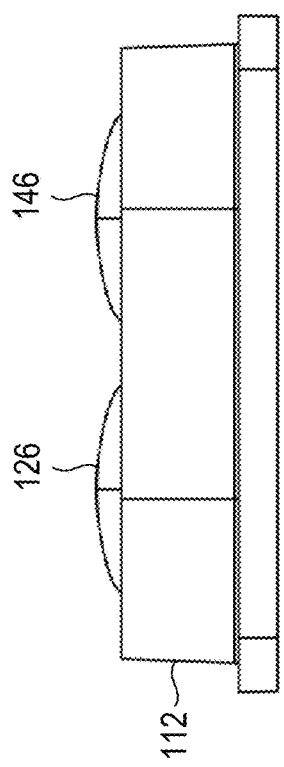
FIG. 3B shows a bottom view of the lens of FIGS. 1 and 2, in accordance with some embodiments.

FIG. 3B shows a bottom view of the lens of FIGS. 1 and 2, in accordance with some embodiments.

FIG. 3C shows a side view of the lens of FIGS. 1 and 2, in accordance with some embodiments.

Figure 4:
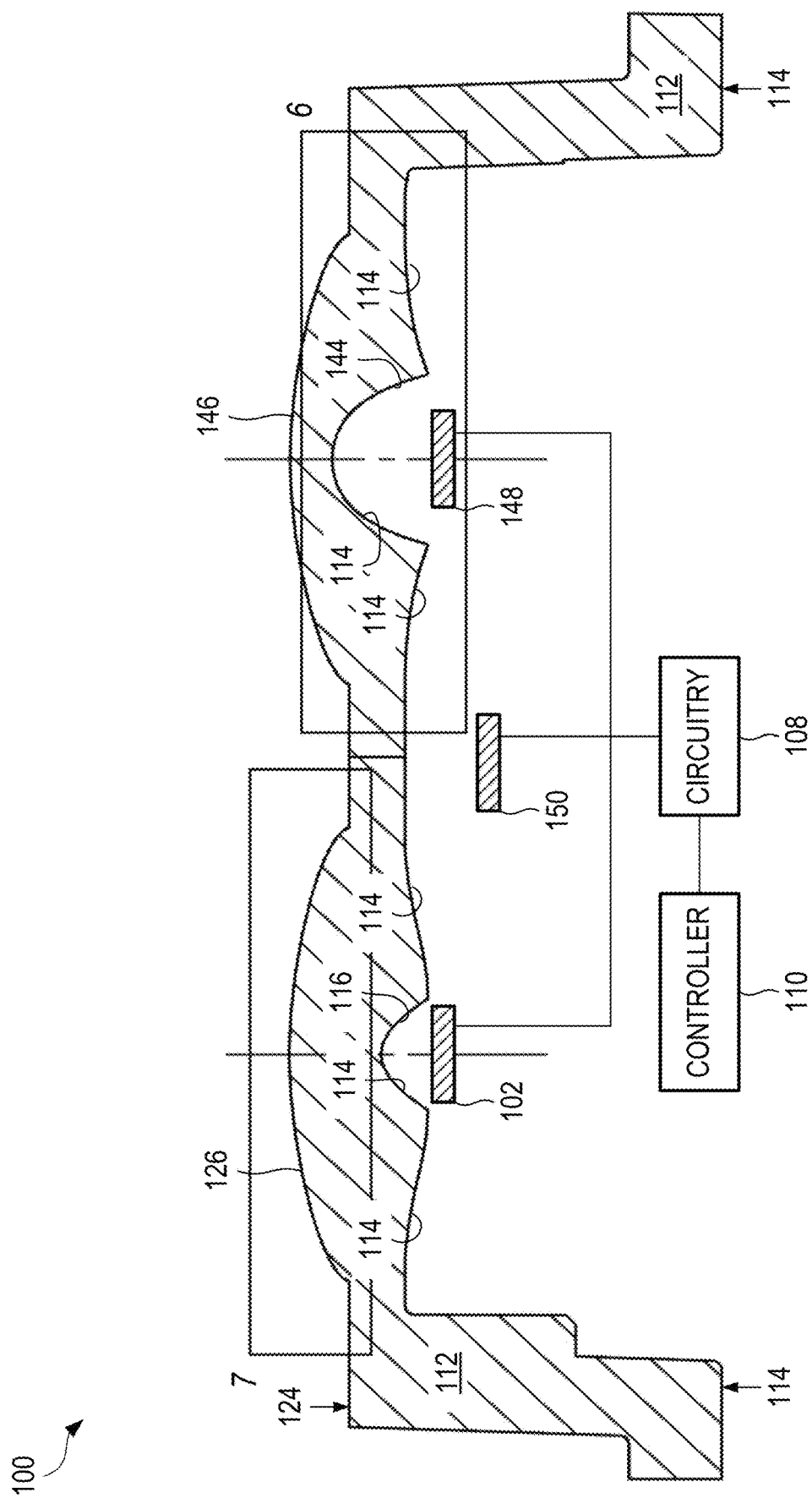

FIG. 4 shows a bottom-facing cross-sectional view of the lens of FIGS. 1 and 2, taken in a broken cross-section shown in FIG. 3A, with a controller, circuitry and LEDs, in accordance with some embodiments.

Figure 5:
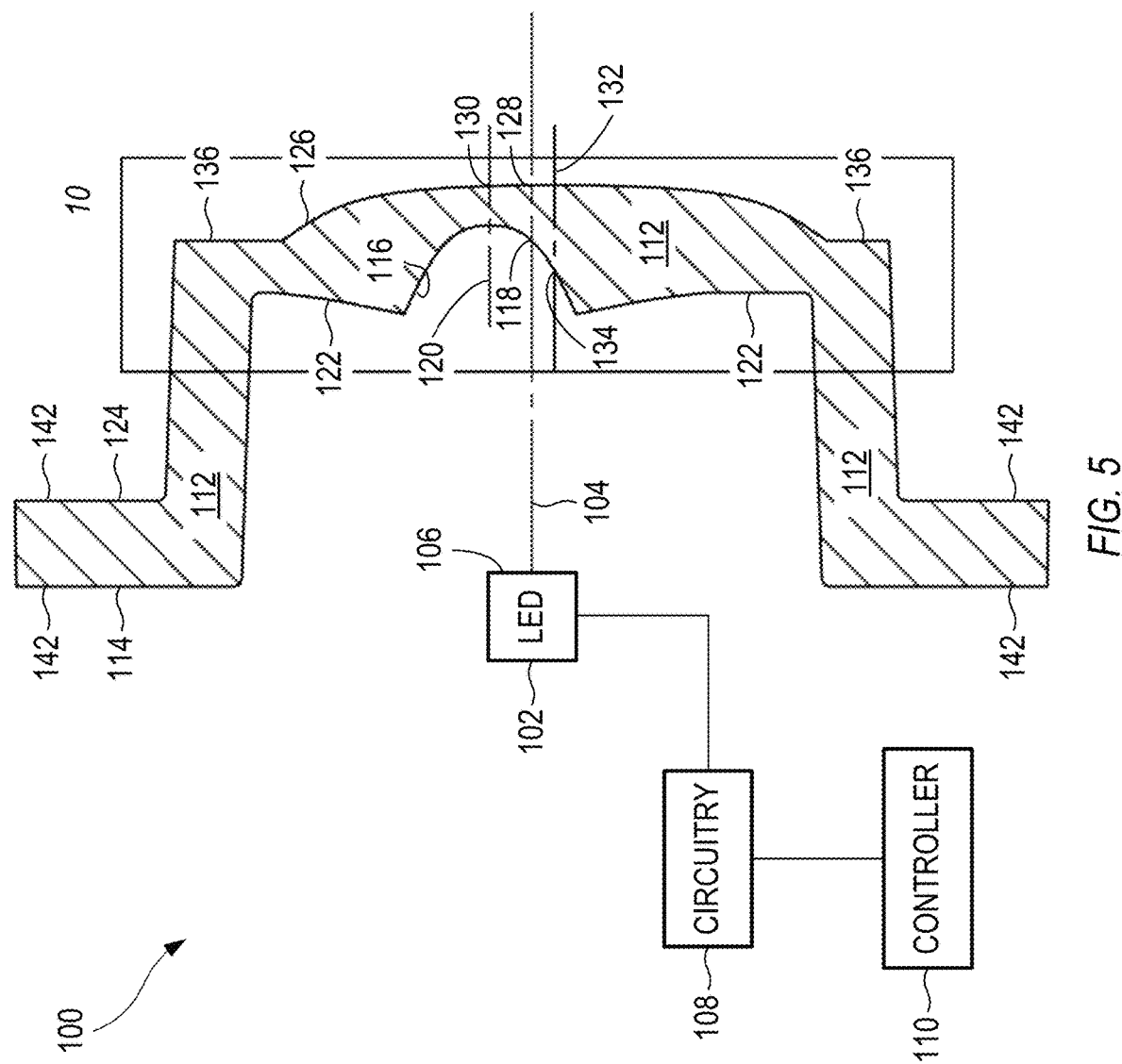

FIG. 5 shows a (right) side cross-sectional view of the lens of FIGS. 1 and 2, taken in a cross-section shown in FIG. 3A, with a controller, circuitry and an LED, in accordance with some embodiments.

Figure 6:
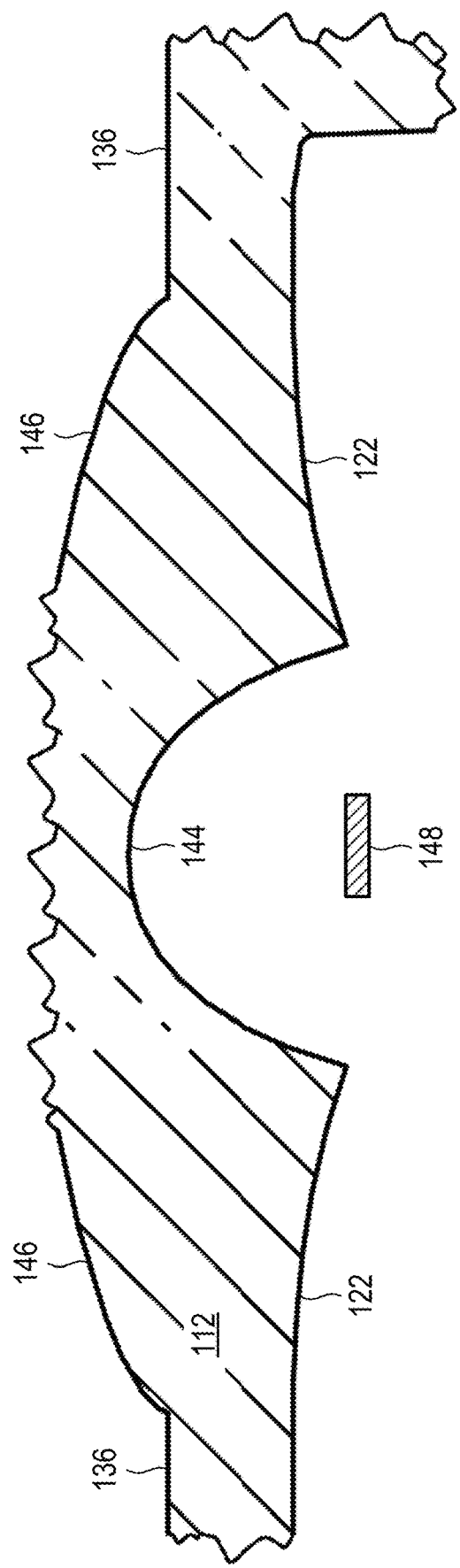

FIG. 6 shows a close-up of a first portion of the cross-sectional view of FIG. 4, the first portion extending through a center of a concave surface of the lens, with an LED, in accordance with some embodiments.

Figure 7:
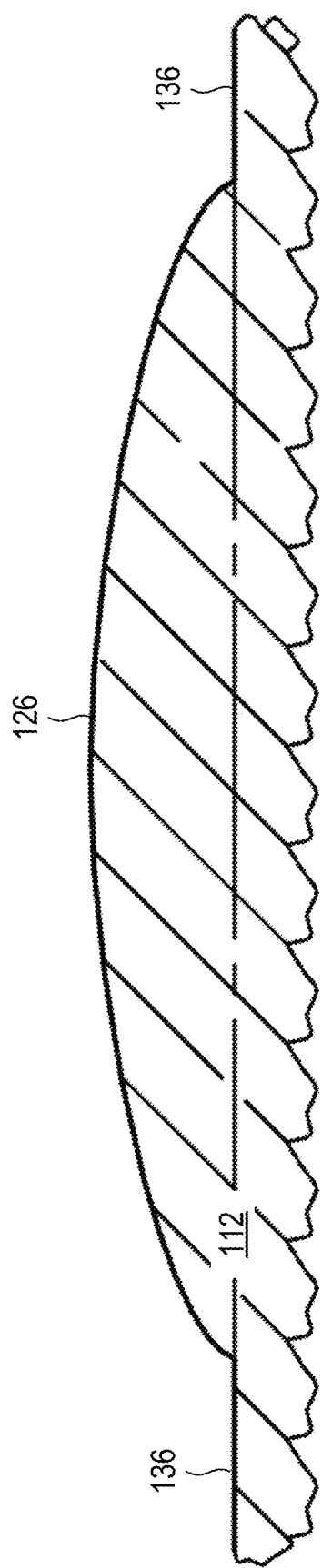

FIG. 7 shows a close-up of a second portion of the cross-sectional view of FIG. 4, the second portion being decentered with respect to the concave surface of the lens, in accordance with some embodiments.

Figure 8B:
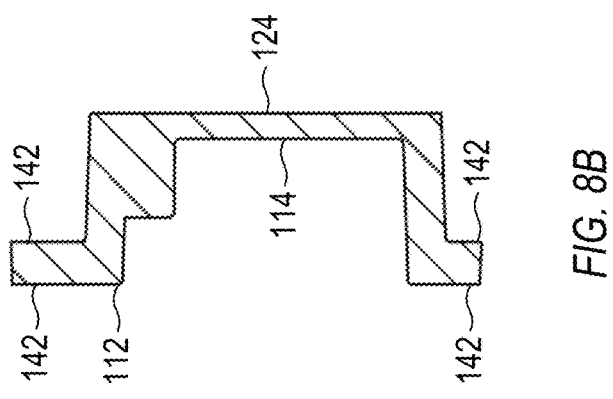
FIG. 8B shows a side cross-sectional view of the lens of FIGS. 1 and 2, taken in a cross-section shown in FIG. 8A, in accordance with some embodiments.
Figure 8A:
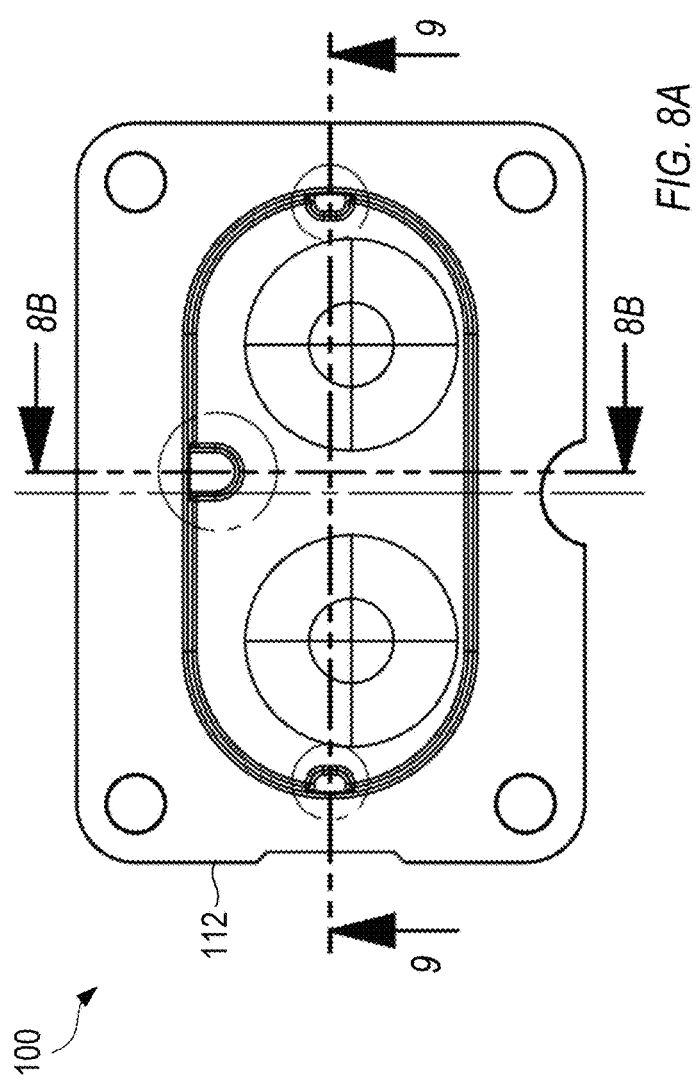
FIG. 8A shows a rear view of the lens of FIGS. 1 and 2, in accordance with some embodiments.

FIG. 8A shows a rear view of the lens of FIGS. 1 and 2, in accordance with some embodiments.

FIG. 8B shows a side cross-sectional view of the lens of FIGS. 1 and 2, taken in a cross-section shown in FIG. 8A, in accordance with some embodiments.

Figure 9:
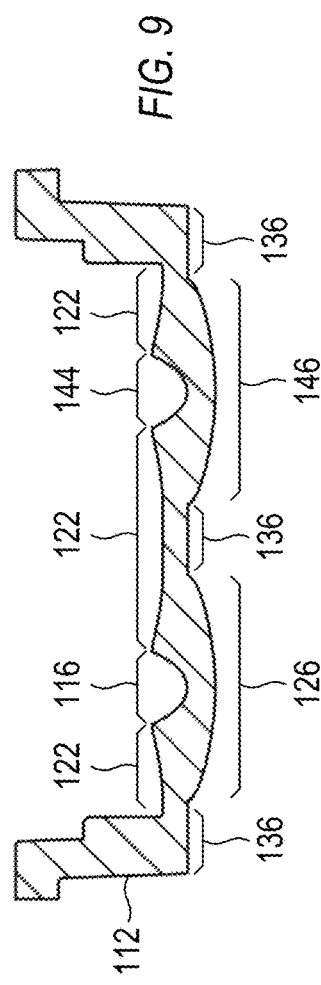

FIG. 9 shows a bottom cross-sectional view of the lens of FIGS. 1 and 2, taken in a cross-section shown in FIG. 8A, in accordance with some embodiments.

Figure 10:
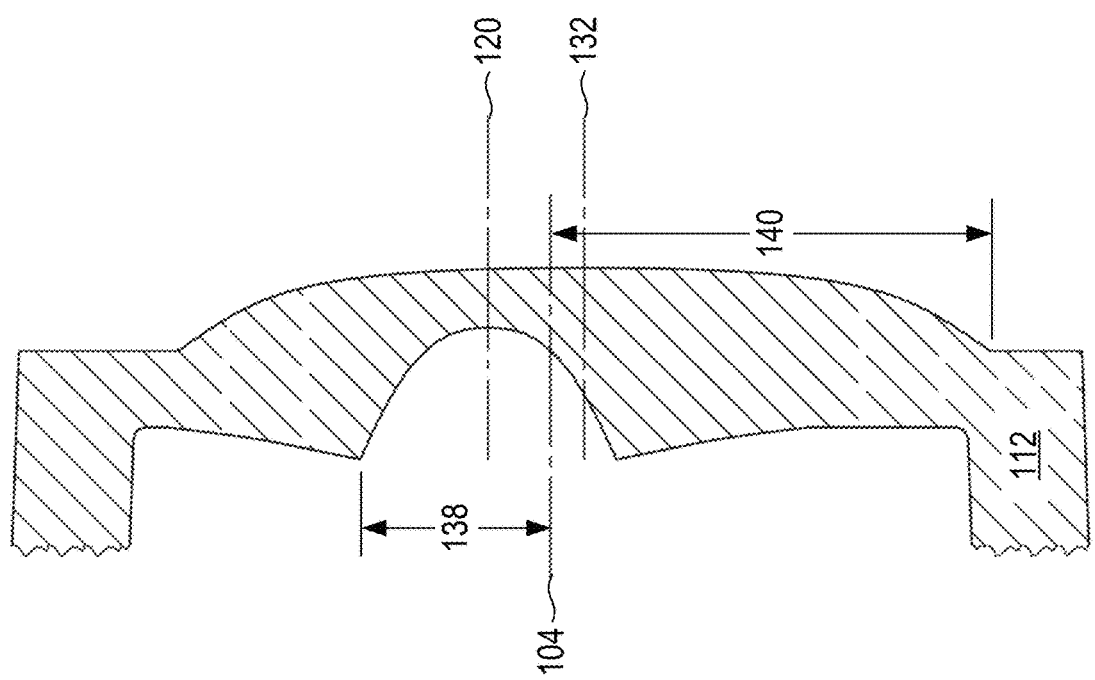

FIG. 10 shows a close-up of the (right) side cross-sectional view of FIG. 5, in accordance with some embodiments.

Figure 11:
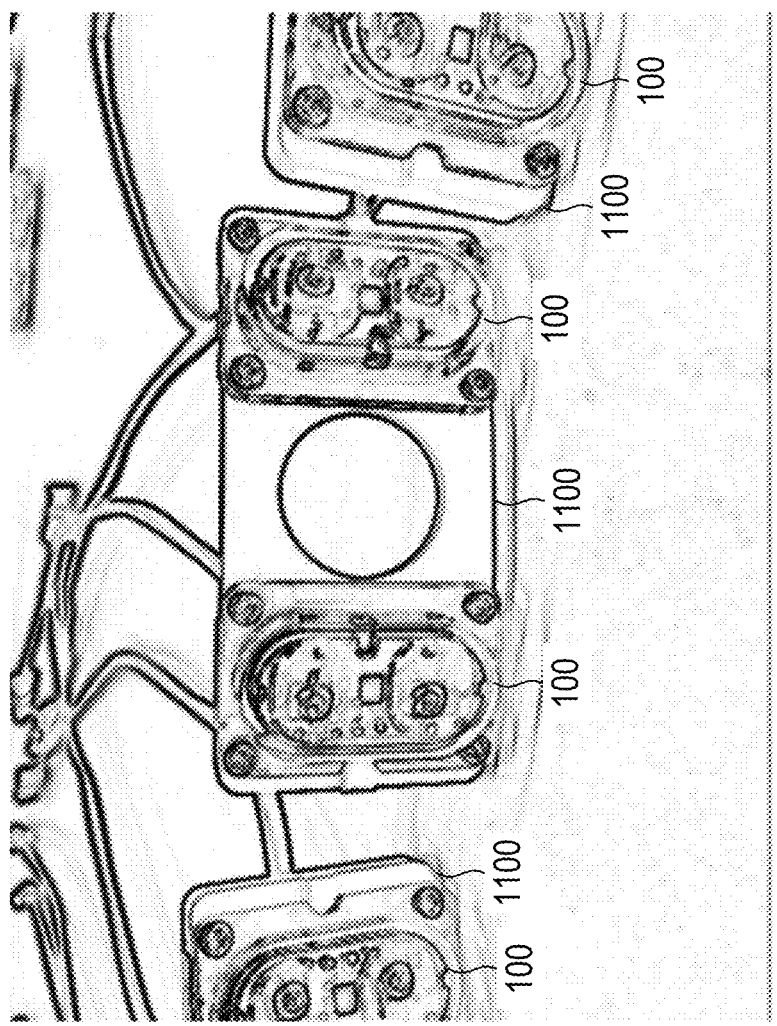
FIG. 11 shows an example of system that can include the apparatus of FIGS. 1-10, in accordance with some embodiments.

FIG. 11 shows an example of system 1100 that can include the apparatus 100 of FIGS. 1-10, in accordance with some embodiments.

An LED 102 (see FIG. 5) can emit light that is substantially centered around an LED axis 104 (see FIG. 5). In some examples, the LED axis 104 can extend substantially orthogonally to an emission surface 106 (see FIG. 5) of the LED 102. In some examples, the LED axis 104 can intersect the LED 102 at a center of the emission surface 106 of the LED 102. In some examples, the emission of the LED 102 can have an emission pattern that peaks along a direction parallel to the LED axis 104, and falls to substantially zero along a direction orthogonal to the LED axis 104 (e.g., parallel to the emission surface 106 of the LED 102). In some examples, the emission pattern can be Lambertian in shape (e.g., the emission pattern can obey Lambert's cosine law). Other suitable emission patterns can also be used. In some examples, the LED 102 can emit light over a relatively narrow range of wavelengths, such as in the range of about 1% to about 2% of a central wavelength. In some examples, the narrow range can include wavelengths that are only in the infrared portion of the electromagnetic spectrum (e.g., are outside the visible spectrum). In other examples, the narrow range of wavelength can extend into the visible portion of the electromagnetic spectrum.

Circuitry 108 (see FIG. 5) can power the LED 102. In some examples, the circuitry 108 can allow a controller 110 (see FIG. 5) or at least one processor coupled to the circuitry 108 to switch the LED 102 on or off at specified times, and, optionally, control an intensity of the LED 102. For example, the controller 110 can generate a trigger signal that can toggle between two voltages, with the toggling occurring at times at which the LED 102 is to be switched on or off. In this example, the circuitry 108 can receive the trigger signal, and supply electrical power to the LED 102 to coincide with the switching on or off of the LED 102 at the toggling times. In other examples, the controller 110 can supply a voltage that can have one of a specified number of discrete values, which can correspond to specified discrete power levels for the LED 102. In still other examples, the controller 110 can supply a voltage that can vary over a continuous range, corresponding to a continuous variation in the power level for the LED 102.

A lens 112 can shape light emitted from the LED 102. In some examples, the lens 112 can have a negative optical power such that the lens 112 can angularly widen light emitted from the LED 102. In some examples, the lens 112 can produce uniform, or nearly uniform, illumination over a specified angular range or a specified field of view. In some examples, the lens 112 and the LED 102 can be paired with a second LED and a second lens portion to produce uniform, or nearly uniform, illumination over a specified angular range or a specified field of view. In other examples, the lens 112 can include multiple lens portions, and the LED 102 can be one of a plurality of LEDs, all of which, when operated together or in a specified combination, can produce uniform, or nearly uniform, illumination over a specified angular range or a specified field of view. In any or all of these examples, the specified field of view can optionally correspond to a field of view of a camera that can capture video images of the surroundings of a vehicle.

The lens 112 can include an incident surface 114 (see FIG. 5) positioned to face the LED 102. The incident surface 114 can be sectioned into portions, with each portion performing a specified function. Several of these portions are explained below.

The incident surface 114 can include a concave portion 116 (see FIG. 5). In some examples, the concave portion 116 can have negative optical power so that the concave portion 116 can angularly widen a light distribution emerging from the LED 102.

The surface of the concave portion 116 can be substantially smooth so as not to substantially scatter light that strikes the concave portion 116 (at least compared with a roughened surface). In particular, it is intended that light striking the concave portion 116 can refract at the surface of the concave portion 116, rather than scatter. For example, a single light ray striking the smooth surface of the concave portion 116 can refract at the surface and exit the surface along a single direction, in accordance with the application of Snell's Law at the surface. In practice, contaminants and surface defects can cause a small amount of unintentional scattering, typically amounting to less than 1% of the optical power incident on the smooth surface. Such unintentional scattering can be neglected for the purposes of this document, and any surface that supports specular (e.g., non-diffuse) reflection or refraction can be considered to be substantially smooth.

The concave portion 116 can intersect the LED axis 104, such as at location 118 (see FIG. 5). Specifically, the LED axis 104 can be extended from the emission surface 106 of the LED 102, and can strike the incident surface 114 of the lens 112 at location 118 within the concave portion 116 of the incident surface 114. The geometry by which the concave portion 116 intersects the LED axis 104 can ensure that the concave portion 116 receives a largely central portion of the light emitted from the LED 102. As a result, the concave portion 116 can receive most of the light emitted by the LED 102. Light emitted away from the largely central portion (e.g., a peripheral portion) can optionally strike the incident surface 114 away from the central portion, or, for rays at the very periphery of the angular distribution, may optionally miss the incident surface 114 entirely. Separating the peripheral portion from the central portion in this manner can improve a uniformity of light emerging from the lens 112.

The concave portion 116 can be substantially centered around a concave portion axis 120 that is non-coaxial with the LED axis 104. As a result, the LED 102 and the concave portion 116, taken together, may not be rotationally symmetric about a common axis. This can lead to an intentional asymmetry in the light emerging from the lens 112. In some examples, by using multiple LEDs 102 and multiple lenses 112, the intentional asymmetries can be combined to form a specified illumination pattern. In some examples, the concave portion axis 120 can be parallel to and offset from the LED axis 104. In other examples, the concave portion axis 120 can be angled (or angularly skewed) with respect to the LED axis 104.

In some examples, the concave portion 116 can be rotationally asymmetric about the concave portion axis 120. The effect of such an asymmetry is that the concave portion 116 can widen the light from the LED 102 by different amounts along different directions. In some examples, such asymmetry can arise as different radii of curvature for different cross-sectional directions of the concave portion 116 (e.g., different slices of the concave portion 116, each slice being a plane that includes the concave portion axis 120). In some examples, such asymmetry can arise as different surface sags along different cross-sectional directions, where the surface sag can be defined as zero at the intersection of the concave portion axis 120 and the concave portion 116, and a longitudinal component of distance away from the intersection (e.g., a component of distance that is parallel to the concave portion axis 120). In some examples, the concave portion 116 can have a first radius of curvature (or a first surface sag) along a first direction, and a second radius of curvature (or a second surface sag) along a second direction, which is typically orthogonal to the first direction. In some examples, the concave portion 116 can be anamorphic or cylindrical. As an alternative, the concave portion 116 can optionally be rotationally symmetric about the concave portion axis 120.

The incident surface 114 can include a scattering portion 122 (see FIGS. 5 and 9). The scattering portion 122 can intentionally scatter light at the surface of the scattering portion 122, rather than refract or specularly reflect the light. For example, a single light ray striking the scattering portion 122 can scatter into a range of exiting angles. In some examples, the scattering can be relatively minor, where the range of exiting angles in centered about (or at least includes) the angle at which a refraction or specular reflection would occur. In some examples, the scatter can be more intense, where the scattered light has a Lambertian pattern, regardless of incident angle. In some examples, the scattering portion 122 can be concave, with a curved edge (e.g., appearing as a corner in a cross-sectional view) extending between the concave portion 116 and scattering portion 122. In some examples, the scattering portion 122 can be concave, with a curved edge extending between the concave portion 116 and scattering portion 122, and a generally planar area proximate a third LED 150 (discussed below).

In some examples, the scattering portion 122 can be textured so as to scatter light that strikes the scattering portion 122. In some examples, the texture can include a surface roughness, such as a frosting on a surface of the scattering portion 122. Because the frosting can be present on one or more portions of the incident surface 114, and absent on one or more other portions of the incident surface 114, the lens 112 can be considered to be selectively frosted. In some examples, the texture can include one or more microlenses at the scattering portion 122, which can angularly redirect light that strikes the microlenses. In some examples, the texture can include one or more surface features, such as scratches, bumps, or dots, which can impart a suitable angular redirection to light that strikes the surface features. Other suitable scattering-generating mechanisms can also be used, optionally in combination with one another.

The lens 112 can further include an exiting surface 124 opposite the incident surface 114 and positioned to face away from the LED 102 (see FIG. 5). In general, most of the light from the LEDs 102 can enter the lens 112 through the incident surface 114 and exit the lens 112 through the exiting surface 124, although a portion of the light can trace other paths through the lens 112, as explained below.

The exiting surface 124 can include a convex portion 126 (see FIG. 5). In some examples, the convex portion 126 can have positive optical power, to partially (but not fully) offset the negative power of the concave portion 116 of the incident surface 114. In general, using the concave portion 116 and the convex portion 126 in this manner can increase a uniformity of the light emerging from the lens 112.

The convex portion 126 can be substantially smooth so as not to substantially scatter light that strikes the convex portion 126. The conditions for smoothness can be the same as for the concave portion 116, discussed above.

The convex portion 126 can intersect the LED axis 104 and the concave portion axis 120. Specifically, the LED axis 104 can be extended from the emission surface 106 of the LED 102, and can strike the exiting surface 124 of the lens 112 at location 128 (see FIG. 5) within the convex portion 126 of the exiting surface 124. Similarly, the concave portion axis 120 can be extended from the concave portion 116 of the incident surface 114, and can strike the exiting surface 124 of the lens 112 at location 130 (see FIG. 5) within the convex portion 126 of the exiting surface 124. This geometry can ensure that the concave portion 116 and the convex portion 126 are positioned on generally opposing faces of an optical element, rather than on faces that are strongly angled with respect to one another, such as adjacent faces of a cube prism.

The convex portion 126 can be substantially centered around a convex portion axis 132 that is non-coaxial with the LED axis 104. As a result, the LED 102 and the convex portion 126, taken together, may not be rotationally symmetric about a common axis. This can lead to an intentional asymmetry in the light emerging from the lens 112. In some examples, by using multiple LEDs 102 and multiple lens portions, the intentional asymmetries can be combined to form a specified illumination pattern. In some examples, the convex portion axis 132 can be parallel to and offset from the LED axis 104. In other examples, the convex portion axis 132 can be angled (or angularly skewed) with respect to the LED axis 104.

The convex portion axis 132 can intersect the concave portion 116 at location 134 (see FIG. 5). As explained above, this geometry can ensure that the concave portion 116 and the convex portion 126 are positioned on generally opposing faces of an optical element, rather than on faces that are strongly angled with respect to one another, such as adjacent faces of a cube prism.

In some examples, the LED axis 104, the concave portion axis 120, and the convex portion axis 132 can be parallel to one another, coplanar, and offset from one another. In some of these examples, the LED axis 104 can be positioned between the concave portion axis 120 and the convex portion axis 132. In other of these examples, the concave portion axis 120 can be positioned between the LED axis 104 and the convex portion axis 132. In still other of these examples, the convex portion axis 132 can be positioned between the LED axis 104 and the concave portion axis 120.

In some examples, the convex portion 126 can be rotationally asymmetric about the convex portion axis 132. The conditions for such asymmetry are the same as for the optional asymmetry of the concave portion 116, discussed above.

The exiting surface 124 can further include a substantially planar portion 136 that at least partially surrounds the convex portion 126. In some examples, the planar portion 136 can include a surface that is flat to within typical manufacturing and alignment tolerances. In some examples, the planar portion 136 can be generally orthogonal to the LED axis 104, also to within typical manufacturing and alignment tolerances. In other examples, the planar portion 136 can optionally be angled with respect to the LED axis 104.

In some examples, the planar portion 136 of the exiting surface 124 can be substantially smooth so as not to substantially scatter light that strikes the planar portion 136. The conditions for the planar portion 136 being substantially smooth are the same as the conditions for the concave portion 116 of the incident surface 114 or the convex portion 126 of the exiting surface 124 being substantially smooth, as discussed above. In some example, forming the planar portion 136 to be substantially smooth can allow light that misses the convex portion 126 (e.g., light at relatively high propagation angles, with respect to the LED axis 104) to reflect specularly (or nearly specularly) toward the scattering portion 122 of the incident surface 114, to be scattered at the scattering portion 122 of the incident surface 114. Directing the high-propagation-angle light in this manner can improve a uniformity of light exiting the lens 112.

In other examples, the planar portion 136 of the exiting surface 124 can be textured so as to scatter light that strikes the planar portion 136. Scattering light in this manner can also improve a uniformity of light exiting the lens 112.

In some examples, the convex portion 126 can extend over a larger area of the lens 112 than the concave portion 116. More specifically, the concave portion 116 can extend to a maximum of a first radial distance 138 away from the LED axis 104, the convex portion 126 can extend to a maximum of a second radial distance 140 away from the LED axis 104, and the second radial distance 140 can be greater than the first radial distance 138. (See FIG. 10).

In some examples, the incident surface 114 and the exiting surface 124 can include perimeters 142 (see FIG. 5) that are shaped to form a generally planar flange that is generally orthogonal to the LED axis 104. The flange can be used to secure the lens against a reference surface, such as a generally planar surface of a housing. In some examples, the flange can be offset toward the incident surface 114 of the lens 112. In other examples, the flange can be offset toward the exiting surface 124 of the lens 112, or centered between the incident surface 114 and the exiting surface 124.

In some examples, the apparatus can include additional LEDs that direct light through the lens 112. In some examples, the lens 112 can modify the angular outputs of the multiple LEDs to produce a uniform, a generally uniform, or an otherwise specified output over a specified range of angles or a specified field of view. For configurations that include multiple LEDs, the incident surface 114 can further include a second concave portion 144 (see FIG. 9) separated from the concave portion 116. For these examples, the scattering portion 122 can extend from the concave portion 116 to the second concave portion 144. For these examples, the exiting surface 124 can include a second convex portion 146 separated from the convex portion 126. For these examples, the planar portion 136 can surround the second convex portion 146. For these examples, the second concave portion 144 and the second convex portion 146 can shape light emerging from a second LED 148 (see FIG. 4) that can be spaced apart from the LED 102. For some of these configurations, the LED 102 and the second LED 148 can emit infrared light. A third LED 150 (see FIG. 4), optionally positioned between the LED 102 and the second LED 148, can emit visible light through the lens 112 to enter the lens 112 via the scattering portion 122 of the incident surface 114.

In some examples, when the apparatus 100 is operational, the LED 102, the second LED 148, and the third LED 150 are powered, and the visible light from the third LED 150 can exit the lens 112 via the planar portion 136 of the exiting surface 124, the convex portion 126, and the second convex portion 146. In some examples, when the apparatus 100 is non-operational, the LED 102, the second LED 148, and the third LED 150 are not powered, and the frosting of the scattering portion 122, and the optional frosting of the planar portion 136, can help mask the third LED 150, so that the third LED 150 may not be easily seen through the lens 112 in ambient lighting. Suitable circuitry 108 (see FIG. 4) can power the LED 102, the second LED 148, and the third LED 150.

Figure 12:
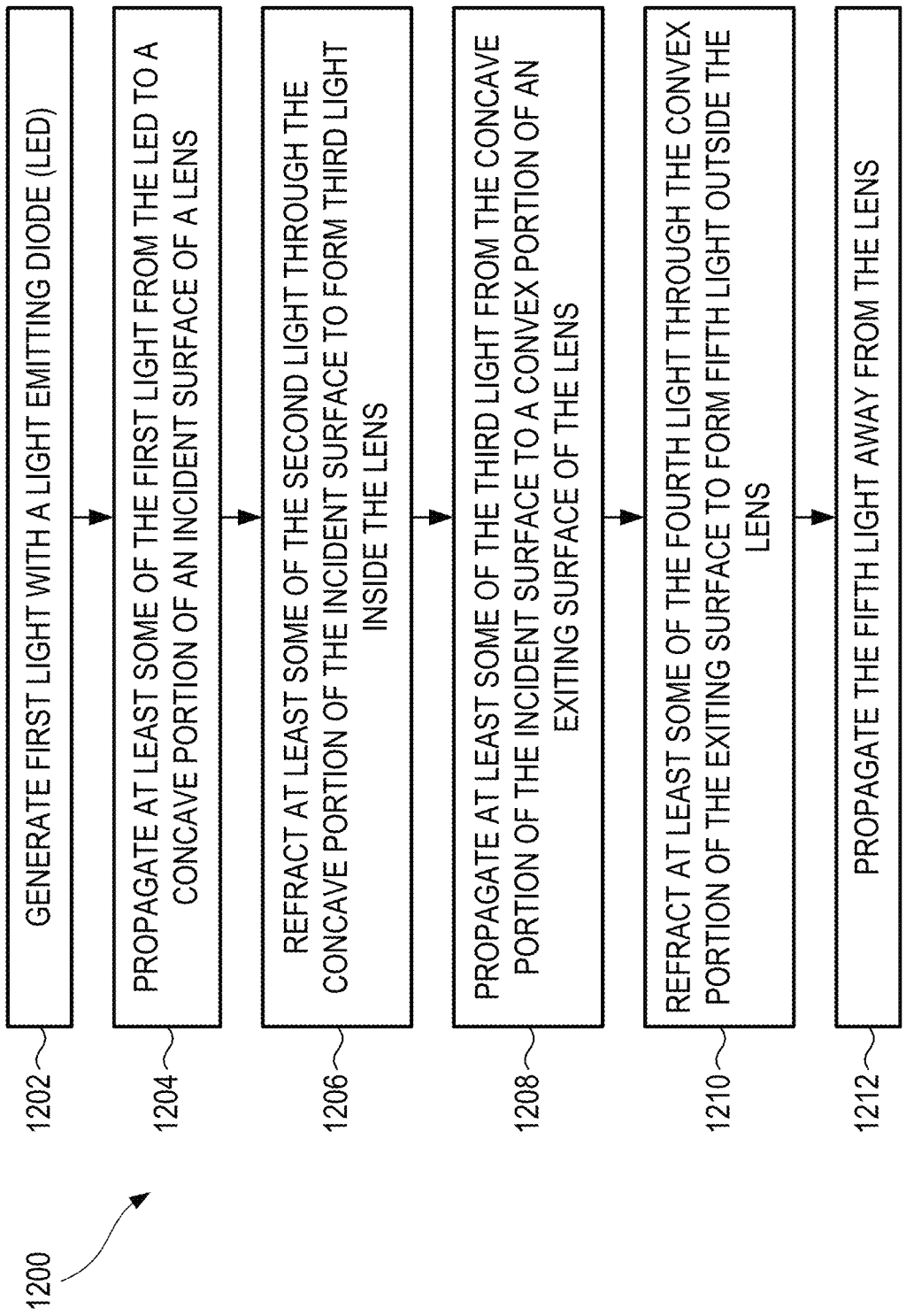
FIG. 12 shows an example of a method for shaping light from an LED, in accordance with some embodiments.

FIG. 12 shows an example of a method 1200 for shaping a light beam from a light emitting diode (LED), in accordance with some embodiments. The method 1200 is suitable for use with the apparatus 100 of FIGS. 1-10, the system 1100 of FIG. 11, as well as other suitable devices, pieces of apparatus, and systems. The method 1200 is but one method for shaping light from an LED; other suitable methods can also be used.

At operation 1202, the apparatus can generate first light with a light emitting diode (LED). The first light can be substantially centered around an LED axis.

At operation 1204, the apparatus can propagate at least some of the first light from the LED to a concave portion of an incident surface of a lens. The propagated first light can arrive at the concave portion as second light. The concave portion can be substantially centered around a concave portion axis that is non-coaxial with the LED axis.

At operation 1206, the apparatus can refract at least some of the second light through the concave portion of the incident surface to form third light inside the lens.

At operation 1208, the apparatus can propagate at least some of the third light from the concave portion of the incident surface to a convex portion of an exiting surface of the lens. The propagated third light can arrive at the convex surface as fourth light. The convex portion can be substantially centered around a convex portion axis that is non-coaxial with the LED axis.

At operation 1210, the apparatus can refract at least some of the fourth light through the convex portion of the exiting surface to form fifth light outside the lens.

At operation 1212, the apparatus can propagate the fifth light away from the lens.

In some examples, the method 1200 can optionally further include reflecting at least some of the fourth light from the convex portion of the exiting surface to form sixth light inside the lens.

In some examples, the method 1200 can optionally further include propagating at least some of the sixth light from the convex portion of the exiting surface to a scattering portion of the incident surface of the lens, the propagated sixth light arriving at the scattering portion as seventh light.

In some examples, the method 1200 can optionally further include scattering at least some of the seventh light with the scattering portion.

To further illustrate the apparatus and related method disclosed herein, a non-limiting list of examples is provided below. Each of the following non-limiting examples can stand on its own, or can be combined in any permutation or combination with any one or more of the other examples.

In Example 1, an apparatus can include: a light emitting diode (LED) configured to emit light that is substantially centered around an LED axis; a lens configured to shape the light emitted from the LED, the lens including an incident surface positioned to face the LED, the incident surface including: a substantially smooth concave portion that is substantially centered around a concave portion axis that is non-coaxial with the LED axis; and a textured scattering portion positioned adjacent to the concave portion.

In Example 2, the apparatus of Example 1 can optionally be further configured such that the concave portion intersects the LED axis.

In Example 3, the apparatus of any one of Examples 1-2 can optionally be further configured such that the concave portion is rotationally asymmetric about the concave portion axis.

In Example 4, the apparatus of any one of Examples 1-3 can optionally be further configured such that the lens further includes an exiting surface opposite the incident surface, the exiting surface including a convex portion.

In Example 5, the apparatus of any one of Examples 1-4 can optionally be further configured such that the convex portion is substantially smooth.

In Example 6, the apparatus of any one of Examples 1-5 can optionally be further configured such that the convex portion intersects the LED axis and the concave portion axis.

In Example 7, the apparatus of any one of Examples 1-6 can optionally be further configured such that: the convex portion is substantially centered around a convex portion axis that is non-coaxial with the LED axis; and the convex portion axis intersects the concave portion.

In Example 8, the apparatus of any one of Examples 1-7 can optionally be further configured such that: the LED axis, the concave portion axis, and the convex portion axis are parallel to one another, are coplanar, and are offset from one another.

In Example 9, the apparatus of any one of Examples 1-8 can optionally be further configured such that the convex portion is rotationally asymmetric about the convex portion axis.

In Example 10, the apparatus of any one of Examples 1-9 can optionally be further configured such that the exiting surface further includes a substantially planar portion that at least partially surrounds the convex portion.

In Example 11, the apparatus of any one of Examples 1-10 can optionally be further configured such that the planar portion is generally orthogonal to the LED axis.

In Example 12, the apparatus of any one of Examples 1-11 can optionally be further configured such that the planar portion is substantially smooth.

In Example 13, the apparatus of any one of Examples 1-12 can optionally be further configured such that the planar portion is textured.

In Example 14, the apparatus of any one of Examples 1-13 can optionally be further configured such that: the concave portion extends to a maximum of a first radial distance away from the LED axis; the convex portion extends to a maximum of a second radial distance away from the LED axis; and the second radial distance is greater than the first radial distance.

In Example 15, the apparatus of any one of Examples 1-14 can optionally be further configured such that the incident surface and the exiting surface include perimeters that are shaped to form a generally planar flange that is generally orthogonal to the LED axis.

In Example 16, the apparatus of any one of Examples 1-15 can optionally further include a second LED spaced apart from the LED and configured to emit light that is substantially centered around a second LED axis, the second LED axis being substantially parallel to the LED axis, the first LED and the second LED further configured to emit infrared light, wherein: the incident surface further includes a second concave portion separated from the concave portion; the scattering portion extends from the concave portion to the second concave portion; the exiting surface includes a second convex portion separated from the convex portion; the planar portion surrounds the second convex portion; and the second concave portion and the second convex portion are configured to shape light emerging from the second LED; and further comprising a third LED positioned between the LED and the second LED, the third LED configured to emit visible light through the lens to enter the lens via the scattering portion of the incident surface.

In Example 17, the apparatus of any one of Examples 1-16 can optionally further include circuitry configured to power the LED, the second LED, and the third LED.

In Example 18, a method can include: generating first light with a light emitting diode (LED), the first light being substantially centered around an LED axis; propagating at least some of the first light from the LED to a concave portion of an incident surface of a lens, the propagated first light arriving at the concave portion as second light, the concave portion being substantially centered around a concave portion axis that is non-coaxial with the LED axis; refracting at least some of the second light through the concave portion of the incident surface to form third light inside the lens; propagating at least some of the third light from the concave portion of the incident surface to a convex portion of an exiting surface of the lens, the propagated third light arriving at the convex surface as fourth light, the convex portion being substantially centered around a convex portion axis that is non-coaxial with the LED axis; refracting at least some of the fourth light through the convex portion of the exiting surface to form fifth light outside the lens; and propagating the fifth light away from the lens.

In Example 19, the method of Example 18 can optionally further include: reflecting at least some of the fourth light from the convex portion of the exiting surface to form sixth light inside the lens; propagating at least some of the sixth light from the convex portion of the exiting surface to a scattering portion of the incident surface of the lens, the propagated sixth light arriving at the scattering portion as seventh light; and scattering at least some of the seventh light with the scattering portion.

In Example 20, a system can include: a first light emitting diode (LED) configured to emit infrared light that is substantially centered around a first LED axis; a second LED configured to emit infrared light that is substantially centered around a second LED axis, the second LED axis being substantially parallel to the first LED axis; a third LED positioned between the first LED and the second LED, the third LED configured to emit visible light that is substantially centered around a third LED axis, the third LED axis being substantially parallel to the first LED axis; circuitry configured to power the first LED, the second LED, and the third LED; and a lens configured to shape light emitted from the first LED, the second LED and the third LED, the lens including an incident surface positioned to face the first LED, the second LED, and the third LED, the incident surface including a first concave portion, the first concave portion being substantially smooth so as not to substantially scatter light that strikes the first concave portion, the first concave portion intersecting the first LED axis, the first concave portion being substantially centered around a first concave portion axis that is parallel to and offset from the first LED axis, the first concave portion being rotationally asymmetric about the first concave portion axis, the incident surface including a second concave portion positioned away from the first concave portion, the second concave portion being substantially smooth so as not to substantially scatter light that strikes the second concave portion, the second concave portion intersecting the second LED axis, the second concave portion being substantially centered around a second concave portion axis that is parallel to and offset from the second LED axis, the second concave portion being rotationally asymmetric about the second concave portion axis, the incident surface including a scattering portion positioned away from the first concave portion and the second concave portion, the scattering portion being textured so as to scatter light that strikes the scattering portion, the third LED configured to emit the visible light through the lens to enter the lens via the scattering portion, the lens further including an exiting surface opposite the incident surface, the exiting surface including a convex portion, the convex portion being substantially smooth so as not to substantially scatter light that strikes the convex portion, the convex portion intersecting the first LED axis, the second LED axis, the third LED axis, the first concave portion axis, and the second concave portion axis, the convex portion being substantially centered around a convex portion axis that is parallel to and offset from the first LED axis, and parallel to and offset from the second LED axis, the convex portion axis intersecting the first concave portion and the second concave portion, the first LED axis, the first concave portion axis, and the first convex portion axis being parallel to one another, coplanar, and offset from one another, the first LED axis being positioned between the first concave portion axis and the first convex portion axis, the second LED axis, the second concave portion axis, and the second convex portion axis being parallel to one another, coplanar, and offset from one another, the second LED axis being positioned between the second concave portion axis and the second convex portion axis, the convex portion being rotationally asymmetric about the convex portion axis, the exiting surface further including a substantially planar portion that at least partially surrounds the convex portion, the planar portion being generally orthogonal to the first LED axis, the incident surface and the exiting surface including perimeters that are shaped to form a generally planar flange that is generally orthogonal to the LED axis.

While exemplary embodiments of the present disclosed subject matter have been shown and described herein, it will be obvious to those skilled in the art that such embodiments are provided by way of example only. Numerous variations, changes, and substitutions will now occur to those skilled in the art, upon reading and understanding the material provided herein, without departing from the disclosed subject matter. It should be understood that various alternatives to the embodiments of the disclosed subject matter described herein may be employed in practicing the various embodiments of the subject matter. It is intended that the following claims define the scope of the disclosed subject matter and that methods and structures within the scope of these claims and their equivalents be covered thereby.

What is claimed is:

1. An illumination apparatus, comprising:
a lens configured to shape light that is substantially centered around a light axis,
the lens including an incident surface positioned to accept the light, the incident surface including:
a substantially smooth concave portion that is substantially centered around a concave portion axis that is non-coaxial with the light axis; and
a textured scattering portion positioned adjacent to the concave portion, the textured scattering portion being concave and forming a corner with the concave portion,
the lens further including an exiting surface opposite the incident surface, the exiting surface including:
a convex portion; and
a substantially planar portion that extends from the convex portion along a plane that is generally orthogonal to the light axis.

2. The illumination apparatus of claim 1, wherein the concave portion intersects the light axis.

3. The illumination apparatus of claim 1, wherein the concave portion is rotationally asymmetric about the concave portion axis.

4. The illumination apparatus of claim 1, wherein the convex portion is substantially smooth.

5. The illumination apparatus of claim 1, wherein the convex portion intersects the light axis.

6. The illumination apparatus of claim 1, wherein the convex portion intersects the concave portion axis.

7. The illumination apparatus of claim 1, wherein the convex portion is substantially centered around a convex portion axis that is non-coaxial with the light axis.

8. The illumination apparatus of claim 7, wherein the convex portion axis intersects the concave portion.

9. The illumination apparatus of claim 7, wherein the light axis, the concave portion axis, and the convex portion axis are parallel to one another, are coplanar, and are offset from one another.

10. The illumination apparatus of claim 7, wherein the convex portion is rotationally asymmetric about the convex portion axis.

11. The illumination apparatus of claim 1, wherein the planar portion is substantially smooth.

12. The illumination apparatus of claim 1, wherein the planar portion is textured.

13. The illumination apparatus of claim 1, wherein:
the concave portion extends to a maximum of a first radial distance away from the light axis;
the convex portion extends to a maximum of a second radial distance away from the light axis; and
the second radial distance is greater than the first radial distance.

14. The illumination apparatus of claim 1, wherein the incident surface and the exiting surface include perimeters that are shaped to form a generally planar flange that is generally orthogonal to the light axis.

15. A method, comprising:
receiving first light with a lens, the first light being substantially centered around a light axis;
refracting at least some of the first light through a concave portion of an incident surface of the lens to form second light inside the lens, the concave portion being substantially centered around a concave portion axis that is non-coaxial with the light axis;
propagating at least some of the second light from the concave portion of the incident surface to a convex portion of an exiting surface of the lens, the propagated second light arriving at the convex surface as third light, the convex portion being substantially centered around a convex portion axis that is non-coaxial with the light axis;
refracting at least some of the third light through the convex portion of the exiting surface to form fourth light outside the lens;
reflecting at least some of the third light from the convex portion of the exiting surface to form fifth light inside the lens; and
propagating at least some of the fifth light from the convex portion of the exiting surface to a scattering portion of the incident surface of the lens, the scattering portion being concave and forming a corner with the concave portion, the propagated fifth light arriving at the scattering portion as sixth light.

16. The method of claim 15, further comprising:
propagating the fourth light away from the lens; and
scattering at least some of the sixth light with the scattering portion.

17. The method of claim 15, wherein the exiting surface includes a substantially planar portion that extends from the convex portion along a plane that is generally orthogonal to the light axis.

18. An illumination apparatus, comprising:
a plurality of first light emitting diodes (LEDs) configured to emit light at a first wavelength;
a second LED spaced apart from the plurality of first LEDs and configured to emit light at a second wavelength different from the first wavelength; and
a lens configured to shape the light emitted from the plurality of first LEDs and the second LED,
the lens including an incident surface positioned to face the plurality of first LEDs and the second LED, the incident surface including a plurality of concave portions and a scattering portion,
the lens further including an exiting surface opposite the incident surface, the exiting surface including a plurality of convex portions and a planar portion, the planar portion surrounding at least one convex portion of the plurality of convex portions,
the plurality of concave portions and the plurality of convex portions being configured to shape light emerging from respective first LEDs of the plurality of first LEDs, and
the scattering portion being configured to receive light from the second LED.

19. The illumination apparatus of claim 18, wherein:
the first wavelength is an infrared wavelength; and
the second wavelength is a visible wavelength.

20. The illumination apparatus of claim 18, wherein the second LED is positioned between adjacent first LEDs of the plurality of first LEDs.

* * * * *